United States Patent
Yagi

(10) Patent No.: US 10,483,991 B2
(45) Date of Patent: Nov. 19, 2019

(54) SEMICONDUCTOR DEVICE AND TEST METHOD

(71) Applicant: LAPIS Semiconductor Co., Ltd., Yokohama (JP)

(72) Inventor: Katsuyoshi Yagi, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/232,529

(22) Filed: Dec. 26, 2018

(65) Prior Publication Data

US 2019/0199362 A1  Jun. 27, 2019

(30) Foreign Application Priority Data

Dec. 27, 2017  (JP) ................................. 2017-252234

(51) Int. Cl.
*H03L 7/089* (2006.01)
*G01R 31/26* (2014.01)
*G01R 29/02* (2006.01)

(52) U.S. Cl.
CPC .......... *H03L 7/0895* (2013.01); *G01R 29/023* (2013.01); *G01R 31/2607* (2013.01)

(58) Field of Classification Search
None
See application file for complete search history.

(56) References Cited

U.S. PATENT DOCUMENTS

| 8,638,173 B2* | 1/2014 | Murphy | H03L 7/0891 331/16 |
| 8,723,566 B1* | 5/2014 | Mathur | H03L 7/0898 327/147 |
| 9,705,512 B1* | 7/2017 | Kuan | H03L 7/0891 |

FOREIGN PATENT DOCUMENTS

JP  H09-214388 A  8/1997

* cited by examiner

*Primary Examiner* — Jeffery S Zweizig
(74) *Attorney, Agent, or Firm* — Rabin & Berdo, P.C.

(57) ABSTRACT

A semiconductor device according to the present invention has a PLL circuit which includes: a phase comparison part that detects the phase difference between a reference signal and an oscillation signal to produce a phase difference signal indicative of the phase difference in binary and then output the produces signal to outside through a first external terminal; a voltage conversion part that applies, to a phase difference voltage node, a phase difference voltage having a voltage value corresponding to the phase difference represented by the phase difference signal; an oscillation part that produces, as an oscillation signal, a signal having a frequency depending on the phase difference voltage; and a correction circuit that supplies a correction current to the phase difference voltage node, and upon reception of a test control signal at a second external terminal, supplies a current depending on the test control signal to the phase difference voltage node as a correction current.

5 Claims, 5 Drawing Sheets

SEMICONDUCTOR DEVICE AND TEST METHOD

BACKGROUND

1. Technical Field

The present invention relates to semiconductor devices, and more particularly, to a semiconductor device which includes a PLL (Phase-Locked Loop) circuit, and a method for testing the semiconductor device.

2. Description of the Related Art

A digital PLL circuit is known as a PLL circuit, wherein such a digital PLL circuit includes: a phase comparator configured to produce a phase difference signal indicative of the phase difference in binary between a reference signal and an oscillation signal; and a charge pump configured to supply a current depending on the phase difference signal to a node, thereby producing a phase difference voltage corresponding to the phase difference signal at the node.

On the other hand, a technique has been suggested for such a digital PLL circuit, wherein the technique adjusts, depending on the magnitude of the phase difference mentioned above, the amount of current to be produced by the charge pump (for example, Japanese Patent Application Laid-Open No. Hei. 9-214338). The digital PLL circuit employs such a configuration to thereby reduce the PLL lockup time for the case of greater changes in frequency.

Those PLL circuits mentioned above may be subjected to an error in the phase difference voltage, which is produced by the charge pump, due to variations during manufacture.

In this context, it is conceivable that the semiconductor IC is provided with a correction circuit configured to supply, to the node supplied with the phase difference voltage, a current having a magnitude enough to eliminate the aforementioned error (hereafter, to be referred to as the correction current).

When such a correction circuit is provided in a semiconductor IC that includes the PLL circuit, it is necessary before product shipment to perform a test of checking whether the correction circuit produces a correct correction current. To measure the correction current outside the semiconductor IC, the semiconductor IC is provided with an external terminal configured to output the correction current, which has been outputted from the correction circuit, out of the semiconductor IC, and a switch which is turned ON only during test to output the correction current produced by the correction circuit out of the external terminal.

However, to measure the current value of the correction current, it is necessary to measure the current with high accuracy, thus causing the test to be made with difficulty. In addition, since the aforementioned switch and external terminal are connected to the output end of the correction circuit, there was a possibility of deterioration in the properties of the correction circuit during normal operation due to the parasitic capacitance or leakage path of the switch.

SUMMARY

It is therefore an object of the present invention to provide a semiconductor device and a test method which enable a test before product shipment with ease without inviting any deterioration in properties during normal operation.

A semiconductor device according to the present invention includes a PLL circuit configured to produce an oscillation signal in synchronism with a reference signal. The semiconductor device includes first and second external terminals. The PLL circuit includes: a phase comparison part configured to detect a phase difference between the reference signal and the oscillation signal to produce a phase difference signal indicative of the phase difference in binary; a voltage conversion part configured to convert the phase difference signal into a phase difference voltage having a voltage value corresponding to the phase difference represented by the phase difference signal to apply the phase difference voltage to a phase difference voltage node; an oscillation part configured to produce, as the oscillation signal, a signal having a frequency depending on the phase difference voltage; and a correction circuit configured to supply a correction current for correcting the phase difference voltage to the phase difference voltage node. The phase comparison part outputs the phase difference signal through the first external terminal, and upon reception of a test control signal thorough the second external terminal, the correction circuit produces a current, serving as said correction current depending on the test control signal to supply the produced current to the phase difference voltage node.

A test method according to the present invention tests a semiconductor device having first and second external terminals and a PLL circuit, the PLL circuit including: a phase comparison part configured to detect a phase difference between a reference signal and an oscillation signal to produce a phase difference signal indicative of the phase difference in binary and supply the phase difference signal to the first external terminal; a voltage conversion part configured to convert the phase difference signal into a phase difference voltage having a voltage value corresponding to the phase difference represented by the phase difference signal to apply the phase difference voltage to a phase difference voltage node; an oscillation part configured to produce, as the oscillation signal, a signal having a frequency depending on the phase difference voltage; and a correction circuit configured to supply a correction current for correcting the phase difference voltage to the phase difference voltage node and to produce, upon reception of a test control signal at the second external terminal, a current depending on the test control signal and supply the produced current as the correction current to the phase difference voltage node. The test method includes: a first step of supplying the test control signal to the second external terminal of the semiconductor device; a second step of capturing the phase difference signal outputted from the first external terminal of the semiconductor device; a third step of determining whether a pulse width of the phase difference signal is included within a specified range; and a fourth step of acquiring a test result indicative of the correction circuit being good when the pulse width of the phase difference signal is determined to be included within the specified range, and a test result indicative of the correction circuit being no good when the pulse width of the phase difference signal is determined to be not included within the specified range.

The semiconductor device including the PLL circuit according to the present invention is provided with a correction circuit configured to produce a correction current for eliminating an error that occurs in a phase difference voltage produced in the PLL circuit. Furthermore, such a semiconductor device is provided with an external terminal, for use with a test of the correction circuit before product shipment, to output a binary phase difference signal produced by the phase comparator of the PLL circuit out of the semiconductor device. In the test before product shipment on the semiconductor device, the tester captures the binary phase difference signal produced by the phase comparator through the external terminal to test whether the correction circuit is good depending on whether or not the pulse width of the phase difference signal is included within the specified range.

Such a configuration enables using less expensive testers when compared with a case of testing whether the correction circuit is good by measuring the current value of a correction current outputted from the correction circuit. Furthermore, since such a switch element is not required to output the correction current produced by the correction circuit out of the semiconductor device to the external terminal only during the test, no redundant parasitic capacitance or leakage path is formed which might otherwise occur in the switch element.

Thus, according to the present invention, it is possible to perform a test on the correction circuit before product shipment with ease without inviting deterioration in the properties during normal operation.

DETAILED DESCRIPTION

Figure 1:
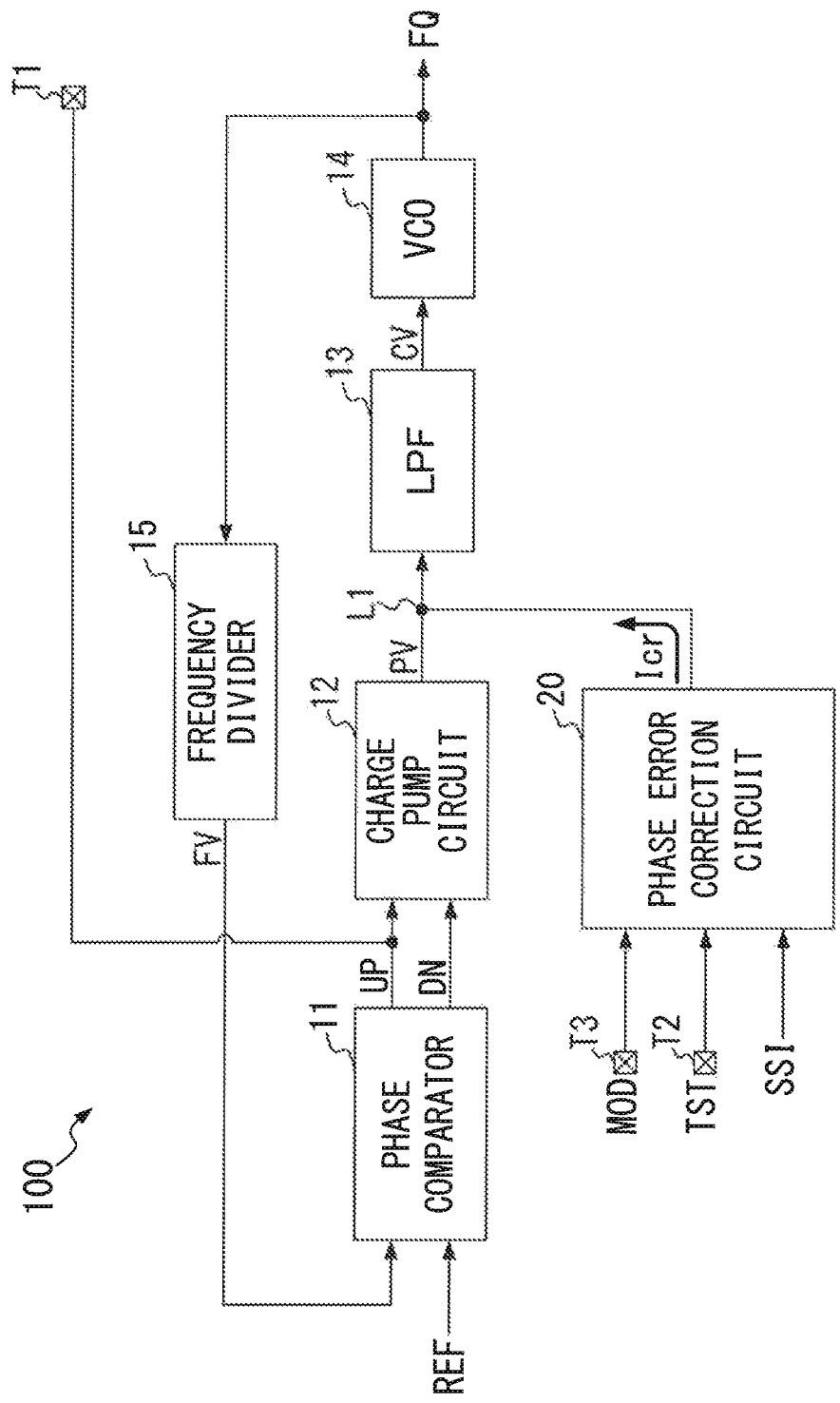
FIG. 1 is a block diagram illustrating a configuration of a PLL circuit 100 included in a semiconductor device according to the present invention.

FIG. 1 is a block diagram illustrating a configuration of a PLL (Phase-Locked Loop) circuit 100 included in a semiconductor IC (Integrated Circuit) chip serving as a semiconductor device according to the present invention.

The PLL circuit 100 produces an oscillation signal FQ in phase synchronism with an entered reference signal REF. Note that the PLL circuit 100 includes a so-called spectrum diffusion function for adding jitter to the oscillation signal FQ in order to prevent energy from concentrating on a particular frequency.

The PLL circuit 100 includes a phase comparator 11, a charge pump circuit 12, a loop filter (LPF) 13, a VCO (Voltage-controlled oscillator) 14, a frequency divider 15, and a phase error correction circuit 20.

The phase comparator 11 detects the phase difference between the rising edge of the reference signal REF having a predetermined frequency and the rising edge of a divided oscillation signal FV supplied from the frequency divider 15.

Figure 2:
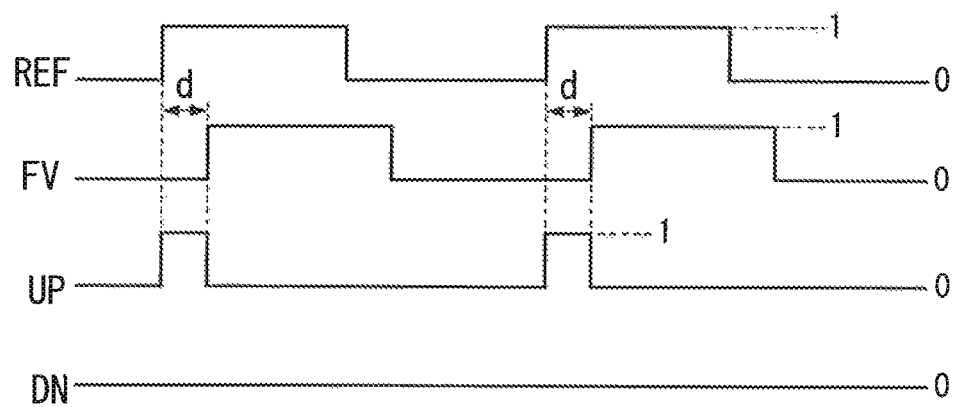
FIG. 2 is a time chart illustrating an operation of a phase comparator 11.

As illustrated in FIG. 2, when the detected phase difference d is indicative of a delay phase by which the rising edge of the divided oscillation signal FV is delayed relative to the rising edge of the reference signal REF, the phase comparator 11 produces a phase difference signal UP at logic level 1 having a pulse width corresponding to the phase difference d. That is, the phase comparator 11 produces the binary phase difference signal UP including a pulse which transitions from the state of logic level 0 to the state of logic level 1, maintains that state just for a duration corresponding to the phase difference d, and then returns to the state of logic level 0.

Figure 3:
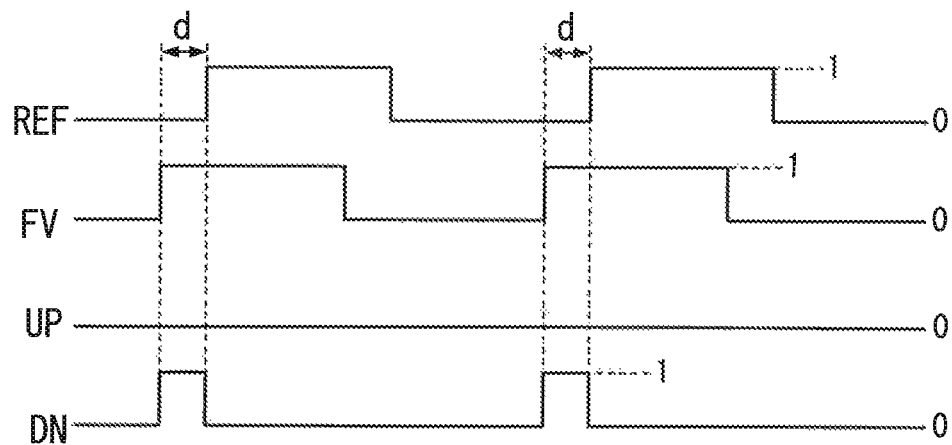
FIG. 3 is a time chart illustrating the operation of the phase comparator 11.

As illustrated in FIG. 3, when the phase difference d is indicative of the advance phase by which the rising edge of the divided oscillation signal FV is advanced relative to the rising edge of the reference signal REF, the phase comparator 11 produces a phase difference signal DN at logic level 1 having a pulse width corresponding to the phase difference d. That is, the phase comparator 11 produces the binary phase difference signal DN including the pulse that transitions from the state of logic level 0 to the state of logic level 1, maintains that state for a duration corresponding to the phase difference d, and then returns to the state of logic level 0.

As described above, the phase comparator 11 detects the phase difference d between the reference signal REF and the divided oscillation signal FV, and then supplies the phase difference signal UP or DN indicative of the phase difference d in binary to the charge pump circuit 12. The phase difference signal UP is supplied to an external terminal T1 of the semiconductor IC chip including the PLL circuit 100, and outputted out of the semiconductor IC chip through the external terminal T1.

The charge pump circuit 12 supplies, to a node L1, a charge pump current having a predetermined current value while the phase difference signal UP is at the state of logic level 1. The charge pump circuit 12 draws, out of the node L1, the charge pump current while the phase difference signal DN is at the state of logic level 1. Supplying the charge pump current to the node L1 causes an increase in the voltage value of the node L1, whereas drawing the charge pump current out of the node L1 causes a drop in the voltage value of the node L1.

Such an operation causes the charge pump circuit 12 to produce, at the node L1 serving as the phase difference voltage node, a phase difference voltage PV having a voltage value corresponding to the pulse width of a pulse included in the phase difference signal (UP, DN).

The loop filter 13 produces a voltage at the node L1 as a control voltage CV, that is, the voltage acquired by smoothing the phase difference voltage PV, and then supplies the phase difference voltage PV to the VCO 14. The VCO 14 produces and outputs the oscillation signal FQ having a frequency corresponding to the voltage value of the control voltage CV. Furthermore, the VCO 14 supplies the resulting oscillation signal FQ to the frequency divider 15. The frequency divider 15 produces the divided oscillation signal FV obtained by dividing the oscillation signal FQ according to a predetermined division ratio or specified division ratio, and then supplies the divided oscillation signal FV to the phase comparator 11.

That is, the loop filter 13, the VCO 14, and the frequency divider 15, which serve as an oscillation part, supply the oscillation signal (FV) having a frequency depending on the phase difference voltage PV to the phase comparator 11.

The phase error correction circuit 20 supplies, to the node L1, a correction current Icr for eliminating an error in the phase difference voltage PV caused by manufacture variations or the like. Note that the correction current Icr may be not only a positive current but also a negative current. That is, when the correction current Icr is positive, the voltage value of the phase difference voltage PV is increased by the amount corresponding to the magnitude of the correction current Icr, whereas when the correction current Icr is negative, the voltage value of the phase difference voltage PV is reduced by the amount corresponding to the magnitude of the correction current Icr.

Figure 4:
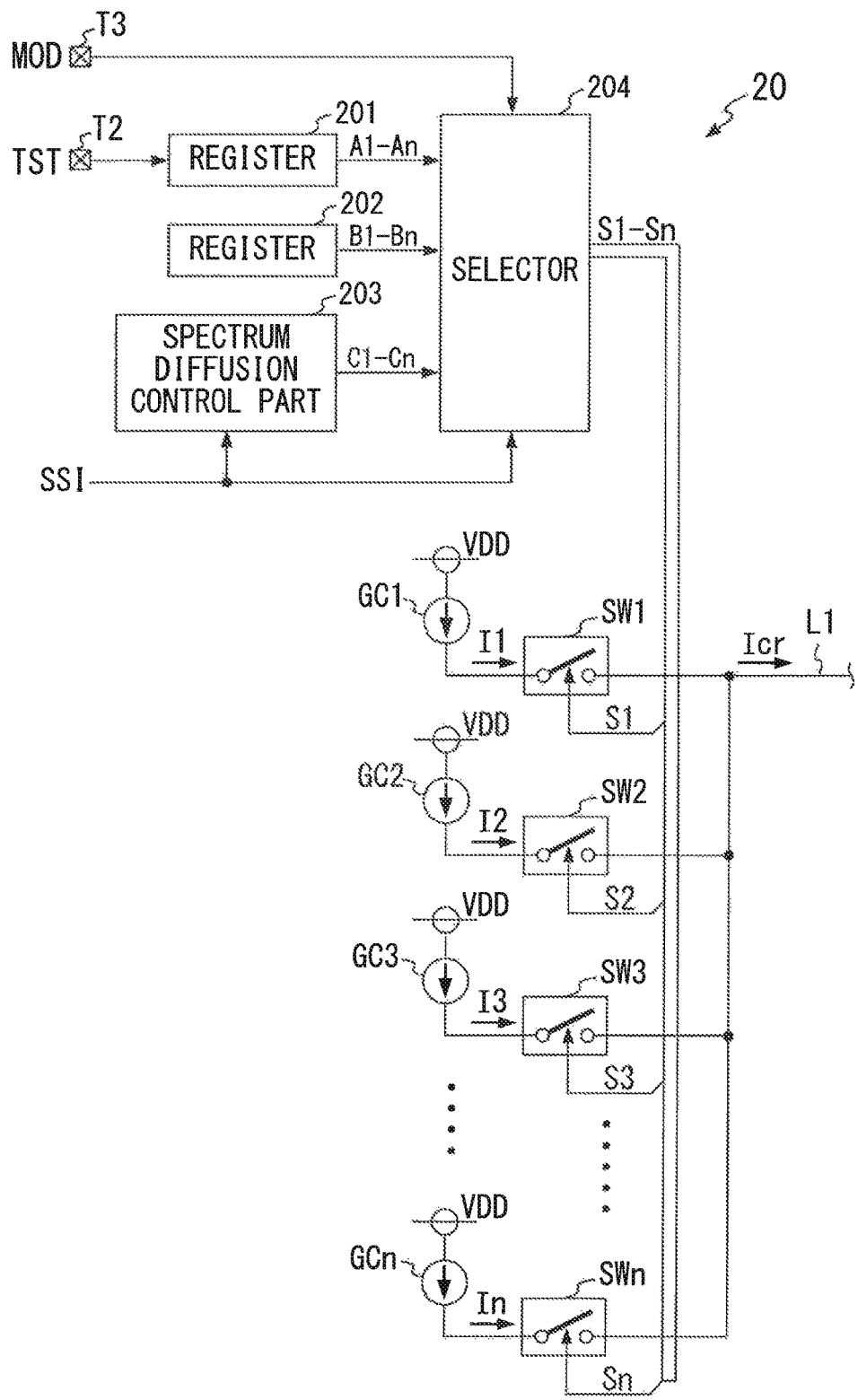
FIG. 4 is a circuit diagram illustrating the internal configuration of a phase error correction circuit 20.

FIG. 4 is a circuit diagram illustrating an exemplary internal configuration of the phase error correction circuit 20. In the example illustrated in FIG. 4, the phase error correction circuit 20 has registers 201, 202, a spectrum diffusion control part 203, a selector 204, current sources GC1 to GCn (n is an integer of 2 or greater), and switch elements SW1 to SWn.

The register 201 is connected to the external terminal T2 of the semiconductor IC chip, and upon reception of a test control signal TST at the external terminal T2, holds switch signals Al to An serving as first current source selection information indicative of a current source specified by the test control signal TST. Note that the first current source selection information specifies a current source to be tested among the current sources GC1 to GCn. The switch signals Al to An set the switch elements SW1 to SWn each individually to either one of an ON state and an OFF state. Each switch element SW supplies, to the node L1, a current which has been produced by a current source GC, connected to that switch element, only in the ON state. The external terminals Tl and T2 are those to be connected, for use with tests, to a tester to test the phase error correction circuit 20.

The register 201 supplies the held first current source selection information (A1 to An) to the selector 204.

The register 202 holds switch signals B1 to Bn serving as second current source selection information indicative of a current source to be used among the current sources GC1 to GCn to produce the correction current Icr mentioned above. Note that like the switch signals A1 to An, the switch signals B1 to Bn set the switch elements SW1 to SWn each individually to either one of an ON state and an OFF state.

The register 202 supplies the held second current source selection information (B1 to Bn) to the selector 204.

The spectrum diffusion control part 203 produces and supplies switch signals C1 to Cn serving as third current source selection information to the selector 204 depending on a spectrum diffusion command signal SSI sent out from, for example, a control part (not illustrated) included in the semiconductor IC chip. The spectrum diffusion control part 203 produces, as the third current source selection information, the switch signals C1 to Cn, which indicate that the number of current sources to become effective with time increases or decreases with time, and then supplies the switch signals C1 to Cn to the selector 204. Note that like the switch signals A1 to An and B1 to Bn, the switch signals C1 to Cn set the switch elements SW1 to SWn each individually to either one of an ON state and an OFF state.

On the basis of an operation mode signal MOD received at an external terminal T3 of the semiconductor IC chip and the spectrum diffusion command signal SSI, the selector 204 selects one from among the first to third current source selection information (A1 to An, B1 to Bn, C1 to Cn).

For example, when the operation mode signal MOD is indicative of a normal mode, the selector 204 selects the second current source selection information (B1 to Bn). On the other hand, when the operation mode signal MOD is indicative of a test mode, the selector 204 selects the first current source selection information (A1 to An) represented by the test control signal TST. Upon reception of the spectrum diffusion command signal SSI, the selector 204 selects the third current source selection information (C1 to Cn) irrespective of the contents of the operation mode signal MOD.

The selector 204 supplies a group of switch signals designated by the current source selection information selected as described above to the switch elements SW1 to SWn as switch signals S1 to Sn. That is, as illustrated in FIG. 4, the selector 204 supplies a switch signal S(k) (k is an integer of 1 to n) to a switch element SW(k).

The current sources GC1 to GCn produce currents I1 to In individually on the basis of a power supply potential VDD to supply the currents I1 to In to the switch elements SW1 to SWn. That is, the current source GC(k) produces a current I(k) on the basis of the power supply potential VDD and then supplies the current I(k) to the switch element SW(k).

The switch elements SW1 to SWn are set individually to one of the ON state and OFF state depending on the switch signals S1 to Sn, so that only when being set to the ON state, the switch elements SW1 to SWn send out a current, which has been supplied to each element, to the node L1. That is, the switch element SW(k) is turned into an ON state when the switch signal S(k) is indicative of the ON state, and sends out the current I(k) supplied from the current source GC(k) to the node L1. Note that the switch element SW(k) is turned into an OFF state when the switch signal S(k) is indicative of the OFF state, and stops sending out the current I(k) to the node L1.

The aforementioned configuration allows a current selection part including the selector 204 and the switch elements SW1 to SWn to supply the current synthesized as below on the basis of the operation mode signal MOD to the node L1 as a correction current Icr.

That is, when the operation mode signal MOD is indicative of the normal mode, the current selection part (204, SW1 to SWn) supplies a resultant current to the node L1 as the correction current Icr. The resultant current is a current obtained by synthesizing currents produced by current source GCs designated by the second current source selection information (B1 to Bn) among the current sources GC1 to GCn. Furthermore, when the operation mode signal MOD is indicative of the test mode, the current selection part supplies a resultant current to the node L1 as the correction current Icr. The resultant current is a current obtained by synthesizing currents produced by current source GCs designated by the first current source selection information (B1 to Bn) represented by the test control signal TST.

Upon reception of the spectrum diffusion command signal SSI, the current selection part supplies a resultant current to the node L1 as the correction current Icr. The resultant current is a current obtained by synthesizing currents produced by current source GCs having number of which is designated by the third current source selection information (C1 to Cn).

Concerning the operation of the phase error correction circuit 20, a description will next be given separately of the normal operation after product shipment (with and without spectrum diffusion) and the test to be carried out before product shipment.

[Normal Operation: Without Spectrum Diffusion]

First, in response to power-on, the register 202 of the phase error correction circuit 20 holds the second current source selection information (B1 to Bn) for producing the correction current Icr that is supplied to the node L1 in order to eliminate an error in the phase difference voltage PV caused by manufacture variations or the like. During the normal operation, the operation mode signal MOD, for example, having the ground potential for specifying the normal mode is supplied to the external terminal T3.

This allows the selector 204 of the phase error correction circuit 20 to supply the switch signals B1 to Bn serving as the second current source selection information held in the register 202 to the switch elements SW1 to SWn as the switch signals S1 to Sn. The phase error correction circuit 20 supplies a resultant current to the node L1 as the correction current Icr. The resultant current is a current obtained by synthesizing currents sent out of each switch element SW that is set to an ON state by the switch signals B1 to Bn among the currents Il to In produced by the current sources GC1 to GCn.

[During Normal Operation: with Spectrum Diffusion]

During the aforementioned normal operation, when being supplied with the spectrum diffusion command signal SSI for urging the execution of spectrum diffusion from the control part included in the semiconductor IC chip, the phase error correction circuit 20 performs the processing below.

That is, the selector 204 of the phase error correction circuit 20 supplies the switch signals C1 to Cn serving as the third current source selection information produced by the spectrum diffusion control part 203 to the switch elements SW1 to SWn as the switch signals S1 to Sn. According to such switch signals C1 to Cn, the number of switch elements SW that is set to an ON state in the switch elements SW1 to SWn is increased or decreased with time. This is followed by the magnitude of the correction current Icr supplied to the node L1 being increased or decreased with time. This allows the so-called spectrum diffusion processing which is performed on the PLL circuit 100 and in which the oscillation signal FQ produced in the PLL circuit 100 is varied in frequency with time.

[Test of the Phase Error Correction Circuit 20]

Figure 5:
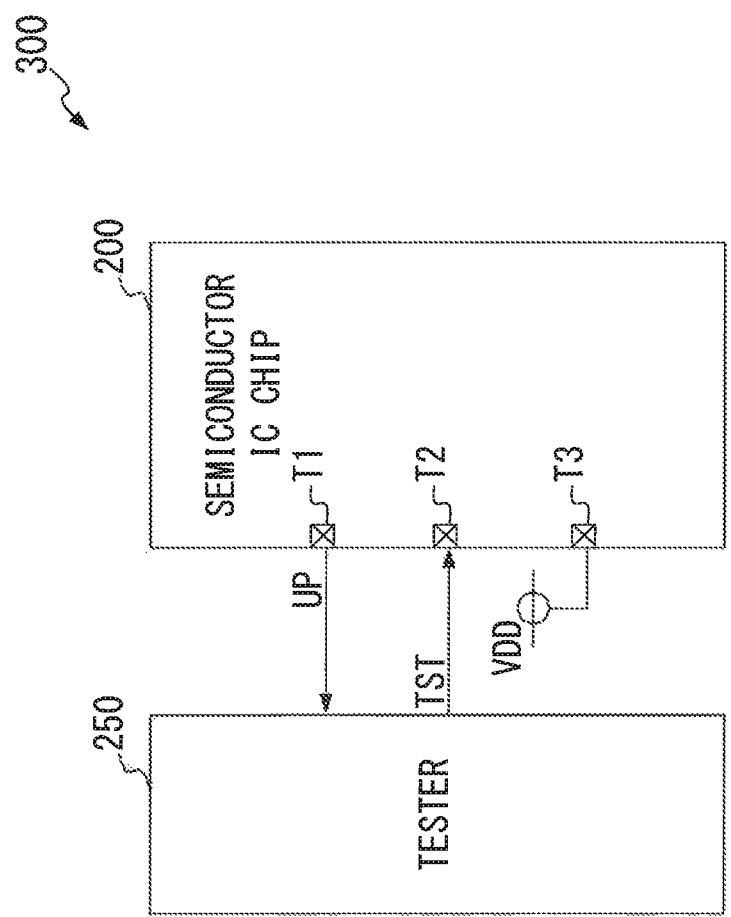
FIG. 5 is a block diagram illustrating a configuration of a test system 300.

FIG. 5 is a block diagram illustrating a configuration of a test system 300 for performing a test before product shipment on the semiconductor IC chip 200 including the PLL circuit 100.

In the test system 300 illustrated in FIG. 5, a tester 250 is connected to the external terminals Tl and T2 of the semiconductor IC chip 200 to be tested. The external terminal T3 of the semiconductor IC chip 200 is supplied with the operation mode signal MOD having the power supply potential VDD in order to specify the test mode. This allows the selector 204 of the phase error correction circuit 20 to supply the switch signals Al to An, which serves as the first current source selection information represented by the test control signal TST sent out of the tester 250, to the switch elements SW1 to SWn as the switch signals S1 to Sn.

Figure 6:
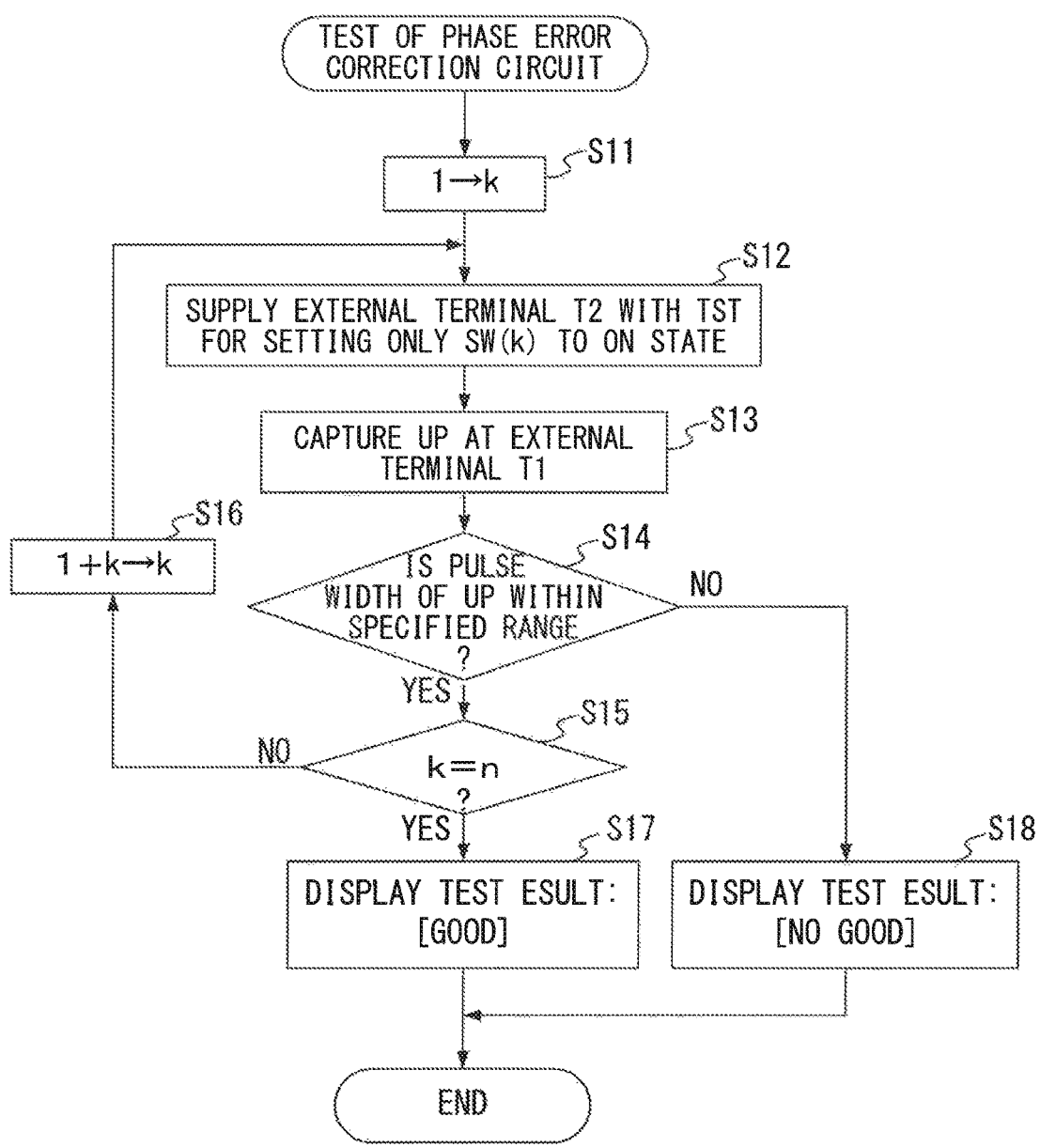
FIG. 6 is a flowchart illustrating a test method for the phase error correction circuit 20.

The tester 250 follows the procedure in accordance with the test method for the phase error correction circuit illustrated in FIG. 6 so as to test the phase error correction circuit 20 of the PLL circuit 100 included in the semiconductor IC chip 200.

In FIG. 6, first, the tester 250 stores an initial value "1" as a symbol k, which is indicative of a switch element to be set to an ON state, in a built-in register (not illustrated) (Step S11).

Next, the tester 250 supplies, to the external terminal T2 of the semiconductor IC chip 200, the test control signal TST which is indicative of the first current source selection information (Al to An) for setting only SW(k) to an ON state among the switch elements SW1 to SWn of the phase error correction circuit 20 (Step S12).

Executing Step S12 allows only the current I(k) produced by the current source GC(k) among the current sources GC1 to GCn of the phase error correction circuit 20 to be sent out to the node L1 of the PLL circuit 100 through the switch element SW(k). That is, the current I(k) produced by the current source GC(k) is supplied to the node L1 as the correction current Icr with no changes made thereto.

This causes the voltage value of the phase difference voltage PV to be increased by the amount corresponding to the magnitude of the correction current Icr, allowing the oscillation signal FQ produced in the VCO 14 to be increased in frequency by that amount. As illustrated in FIG. 2, when the phase of the rising edge of the divided oscillation signal FV is delayed relative to that of the rising edge of the reference signal REF, the phase comparator 11 outputs the binary phase difference signal UP having a pulse width corresponding to the phase difference d. Note that the pulse width of the phase difference signal UP illustrated in FIG. 2 depends on the magnitude of the correction current Icr. Therefore, if the current value of the current I(k) serving as the correction current Icr has a desired value, the pulse width of a pulse included in the phase difference signal UP is equal to a predetermined pulse width. Thus, measuring the pulse width of the phase difference signal UP makes it possible to determine whether the current source GC(k) produces the current I(k) having an adequate current value.

In this context, after the execution of Step S12, the tester 250 first captures the phase difference signal UP sent out of the external terminal T1 of the semiconductor IC chip 200 (Step S13). Then, the tester 250 measures the pulse width of the captured phase difference signal UP to determine whether the pulse width is included within a predetermined specified range (Step S14). If the pulse width of the phase difference signal UP is included within the predetermined specified range, it is to be understood that the current source GC(k) produces the current I(k) having an adequate current value.

In Step S14, when it is determined that the pulse width of the phase difference signal UP is included within the specified range, the tester 250 determines whether the symbol k matches "n" that is the total number of switch elements SW (Step S15).

If it is determined in Step S15 that the symbol k does not match "n", the tester 250 adds one to the symbol k stored in the built-in register and then overwrites the built-in register with the resulting symbol k (Step S16). After the execution of Step S16, the tester 250 returns to the execution of Step S12 described above so as to execute the series of operations of Steps S12 to S15 mentioned above.

Meanwhile, if it is determined in Step S15 that the symbol k matches "n", the tester 250 allows a test result indicative of the phase error correction circuit 20 being good to be displayed on, e.g., a display device (not illustrated) (Step S17). If it is determined in Step S14 that the pulse width of the phase difference signal UP is not included in the specified range, the tester 250 allows a test result indicative of the phase error correction circuit 20 being no good to be displayed on the display device (Step S18).

As described above, in the test of the phase error correction circuit 20 illustrated in FIG. 6, the tester 250 executes, n times, Steps S12 to S16 described above, thereby testing the current sources GC1 to GCn one by one so as to determine as mentioned below whether the current source is good.

That is, first, the tester 250 supplies, to the node L1 as the correction current Icr, the current I(k) produced by one current source GC(k) being tested (k is an integer of 1 to n) (S12). Next, the tester 250 captures the phase difference signal UP outputted from the phase comparator 11 (S13). Next, the tester 250 measures the pulse width of a pulse appearing in the captured phase difference signal UP, and then determines whether the pulse width is included within the specified range (S14).

If the pulse width of a pulse appearing in the phase difference signal UP is included within the specified range, the tester 250 determines that the current I(k) produced by the current source GC(k) being tested has an adequate current value, and then subsequently performs the aforementioned series of operations (S12 to S14) on the next current source GC to be tested (S16).

Meanwhile, if it is determined that the pulse width of a pulse appearing in the phase difference signal UP is out of the specified range, the tester 250 acquires a test result indicative of the phase error correction circuit 20 being no good (S18). On the other hand, if it is determined for all the tested n current sources GC1 to GCn that the pulse width of a pulse in the phase difference signal UP is included within the specified range, the tester 250 acquires a test result indicative of the phase error correction circuit 20 being good (S17).

As described above, in the test of the phase error correction circuit 20, the tester 250 measures the pulse width of the binary phase difference signal UP outputted from the phase comparator 11 of the PLL circuit 100, thereby determining whether or not the phase error correction circuit 20 is good.

Therefore, as compared with the case in which the current value itself of the correction current Icr outputted from the phase error correction circuit 20 is measured to thereby determine whether or not the phase error correction circuit 20 is good, it is possible to employ a less expensive tester. Furthermore, since the switch element to be used only during a test for outputting the correction current Icr outputted from the phase error correction circuit 20 to the external terminal of the semiconductor IC chip is not required, no redundant parasitic capacitance or leakage path which would otherwise be caused in the switch element is formed. It is thus possible to prevent deterioration in the properties of the phase error correction circuit 20 during normal operation.

Note that the phase error correction circuit 20 illustrated in FIG. 4 holds, in the register 202, the second current source selection information (B1 to Bn) to be used during the normal mode when power is turned ON. However, for example, fuse elements may also be employed in place of the register 202 in order to fixedly set the value of the switch signals B1 to Bn represented by the second current source selection information.

Furthermore, the PLL circuit 100 of the aforementioned embodiment allows the charge pump circuit 12 to produce the phase difference voltage PV at the node L1 by flowing a current through the node L1 for a duration corresponding to the pulse width of a pulse included in the binary phase difference signal (UP, DN). However, a part configured to convert the binary phase difference signal (UP, DN) into the phase difference voltage PV having an analog voltage value is not limited to the charge pump circuit.

In short, it is acceptable to provide, between the phase comparator 11 and the loop filter 13, a voltage conversion part configured to convert the binary phase difference signal (UP, DN) into the phase difference voltage PV having a voltage value corresponding to the phase difference represented by the phase difference signal and then to apply the phase difference voltage PV to the node L1 serving as the phase difference voltage node.

Furthermore, in order to allow the tester 250 to measure the pulse width of the phase difference signal (UP, DN) produced by the phase comparator 11, the PLL circuit 100 illustrated in FIG. 1 outputs the phase difference signal UP to outside through the external terminal T1 of the semiconductor IC chip 200. However, it may also be acceptable to output the phase difference signal DN in place of the phase difference signal UP to outside through the external terminal T1.

In short, the PLL circuit 100 may only have to include the phase comparison part, the voltage conversion part, the oscillation part, and the correction circuit to be mentioned below. Furthermore, the semiconductor IC chip 200 including the PLL circuit 100 may only have to include the first and second external terminals (T1, T2) for testing the correction circuit.

That is, the phase comparison part (11) detects the phase difference between the reference signal (REF) and the oscillation signal (FQ), then produces the phase difference signal (UP, DN) indicative of the phase difference in binary, and outputs the phase difference signal out of the semiconductor IC chip 200 through the first external terminal (T1). The voltage conversion part (12) converts the phase difference signal (UP, DN) into the phase difference voltage (PV) having a voltage value corresponding to a phase difference represented by the phase difference signal and applies the phase difference voltage to the phase difference voltage node (L1). The oscillation part (13 to 15) produces a signal having a frequency depending on the phase difference voltage (PV) as the oscillation signal (FQ, FV). The correction circuit (20) supplies the correction current (Icr) to the phase difference voltage node (L1). Here, upon reception of the test control signal (TST) through the second external terminal (T2), the correction circuit (20) produces a current depending on the test control signal and then supplies the produced current to the phase difference voltage node as the correction current.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims. This application is based upon and claims the benefit of priority from the prior Japanese Patent Application No. 2017-252234 filed on Dec. 27, 2017, the entire contents of which are incorporated herein by reference.

What is claimed is:

1. A semiconductor device comprising a PLL circuit configured to produce an oscillation signal in synchronism with a reference signal, and first and second external terminals, wherein said PLL circuit includes:

a phase comparison part configured to detect a phase difference between said reference signal and said oscillation signal to produce a phase difference signal indicative of said phase difference in binary;

a voltage conversion part configured to convert said phase difference signal into a phase difference voltage having a voltage value corresponding to said phase difference represented by said phase difference signal to apply said phase difference voltage to a phase difference voltage node;

an oscillation part configured to produce, as said oscillation signal, a signal having a frequency depending on said phase difference voltage; and a correction circuit configured to supply a correction current for correcting said phase difference voltage to said phase difference voltage node, wherein said phase comparison part outputs said phase difference signal through said first external terminal, and upon reception of a test control signal through said second external terminal, said correction circuit produces a current serving as said correction current depending on said test control signal to supply the produced current to said phase difference voltage node.

2. The semiconductor device according to claim 1, wherein said phase comparison part produces, as said phase difference signal, a signal including a pulse having a pulse width corresponding to said phase difference; and said voltage conversion part is a charge pump circuit configured to flow a current through said phase difference voltage node for a duration corresponding to the pulse width of the pulse included in said phase difference signal, thereby producing said phase difference voltage at said phase difference voltage node.

3. The semiconductor device according to claim 1, further comprising a third external terminal configured to receive an operation mode signal indicative of a normal mode or a test mode, wherein said correction circuit comprises:

first to nth (n is an integer of two or greater) current sources configured to produce first to nth currents;

a first register configured to hold first current source selection information indicative of a current source specified by said test control signal among said first to nth current sources;

a second register configured to hold second current source selection information indicative of a current source to be used among said first to nth current sources; and a current selection part configured to supply, when said operation mode signal is indicative of said normal mode, a first resultant current as said correction current to said phase difference voltage node, the first resultant current being a current obtained by synthesizing currents produced by current sources designated by said second current source selection information among said first to nth current sources, and to supply, when said operation mode signal is indicative of said test mode, a second resultant current as said correction current to said phase difference voltage node, the second resultant current being a current obtained by synthesizing currents produced by current sources designated by said first current source selection information among said first to nth current sources.

4. The semiconductor device according to claim 3, wherein said correction circuit comprises a spectrum diffusion control part configured to produce, depending on a spectrum diffusion command, third current source selection information for increasing or decreasing with time a number of current sources to be used among said first to nth current sources; and said current selection part supplies, upon reception of said spectrum diffusion command, a third resultant current as said correction current to said phase difference voltage node, the third resultant current being a current produced by current sources having number of which is designated by the third current source selection information among said first to nth current sources.

5. A test method for testing a semiconductor device having first and second external terminals and a PLL circuit, the PLL circuit including: a phase comparison part configured to detect a phase difference between a reference signal and an oscillation signal to produce a phase difference signal indicative of said phase difference in binary and supply said phase difference signal to said first external terminal; a voltage conversion part configured to convert said phase difference signal into a phase difference voltage having a voltage value corresponding to said phase difference represented by said phase difference signal to apply the phase difference voltage to a phase difference voltage node; an oscillation part configured to produce, as said oscillation signal, a signal having a frequency depending on said phase difference voltage; and a correction circuit configured to supply a correction current for correcting said phase difference voltage to said phase difference voltage node and to produce, upon reception of a test control signal at said second external terminal, a current depending on said test control signal and supply the produced current as said correction current to said phase difference voltage node, the test method comprising:

a first step of supplying said test control signal to said second external terminal of said semiconductor device;

a second step of capturing said phase difference signal outputted from said first external terminal of said semiconductor device;

a third step of determining whether a pulse width of said phase difference signal is included within a specified range; and a fourth step of acquiring a test result indicative of said correction circuit being good when the pulse width of said phase difference signal is determined to be included within said specified range, and a test result indicative of said correction circuit being no good when said pulse width of said phase difference signal is determined to be not included within the specified range.

* * * * *